US008647809B2

(12) United States Patent
Sullivan et al.

(10) Patent No.: US 8,647,809 B2
(45) Date of Patent: Feb. 11, 2014

(54) METAL-OXIDE FILMS FROM SMALL MOLECULES FOR LITHOGRAPHIC APPLICATIONS

(75) Inventors: Daniel M. Sullivan, Vichy, MO (US); Charles J. Neef, Bastrop, TX (US); Yubao Wang, Rolla, MO (US); Tantiboro Ouattara, Eureka, MO (US)

(73) Assignee: Brewer Science Inc., Rolla, MO (US)

( * ) Notice: Subject to any disclaimer, the term of this patent is extended or adjusted under 35 U.S.C. 154(b) by 59 days.

(21) Appl. No.: 13/178,301

(22) Filed: Jul. 7, 2011

(65) Prior Publication Data

US 2013/0011630 A1   Jan. 10, 2013

(51) Int. Cl.
*G03F 7/00* (2006.01)
*G03F 7/004* (2006.01)

(52) U.S. Cl.
USPC .................. 430/270.1; 430/271.1; 430/273.1

(58) Field of Classification Search
USPC ............................................ 430/270.1, 273.1
See application file for complete search history.

(56) References Cited

U.S. PATENT DOCUMENTS

| 6,303,270 | B1 | 10/2001 | Flaim et al. | |
|---|---|---|---|---|
| 6,451,420 | B1 | 9/2002 | Jin et al. | |
| 6,740,469 | B2 | 5/2004 | Krishnamurthy et al. | |
| 6,890,448 | B2 | 5/2005 | Pavelchek | |
| 7,018,717 | B2 | 3/2006 | Pavelchek | |
| 7,326,442 | B2 | 2/2008 | Babich et al. | |
| 7,364,832 | B2 * | 4/2008 | Sun et al. | 430/273.1 |
| 8,323,871 | B2 * | 12/2012 | Burns et al. | 430/271.1 |
| 2004/0048194 | A1 | 3/2004 | Breyta et al. | |
| 2004/0058275 | A1 | 3/2004 | Neef et al. | |
| 2006/0030648 | A1 | 2/2006 | Flaim et al. | |
| 2007/0275569 | A1 | 11/2007 | Moghadam et al. | |
| 2008/0107971 | A1 | 5/2008 | Fujii et al. | |
| 2008/0196626 | A1 | 8/2008 | Wu et al. | |
| 2009/0297784 | A1 | 12/2009 | Xu et al. | |

FOREIGN PATENT DOCUMENTS

WO      2008/063016      5/2008

OTHER PUBLICATIONS

Kennedy et al., "A high-Si content middle layer for ArF trilayer patterning," Proc. of SPIE, vol. 6923, 2008, 69230W-1-69230W-10.
Abdallah et al., "Etching spin-on trilayer masks," Proc. of SPIE, vol. 6923, 2008, 69230U-1-69230U-8.
International Search Report and Written Opinion dated Jan. 30, 2013, in corresponding PCT/US2012/044248 filed on Jun. 26, 2012.

* cited by examiner

*Primary Examiner* — Amanda C. Walke
(74) *Attorney, Agent, or Firm* — Hovey Wiliams LLP

(57) ABSTRACT

Metal-oxide films for lithographic applications are provided. The films are formed from compositions comprising metal-oxide precursor compounds including metals and metalloids other than silicon. These films are easily produced and can be modified with a variety of ligands, including alkoxides, phenoxides, carboxylates, beta-diketones, and beta-ketoesters.

28 Claims, 3 Drawing Sheets

METAL-OXIDE FILMS FROM SMALL MOLECULES FOR LITHOGRAPHIC APPLICATIONS

BACKGROUND OF THE INVENTION

1. Field of the Invention

The present invention relates in general to new hardmask compositions having improved etch resistance for use in the manufacture of microelectronics devices. The compositions comprise metal-oxide precursors dispersed or dissolved in a solvent system.

2. Description of Related Art

The advances of microelectronic manufacture are reflected by the density and dimensions of semiconductor structures created by the microphotolithographic process. The demand for high density and small critical dimension (CD) has been constantly pushing photolithography technology to its limits. To keep pace with the semiconductor industry roadmap, next-generation patterning materials and innovative lithographic processes will be needed to work in unison for high-resolution lithography. As critical feature sizes keep shrinking to 32 nm and beyond, and while the aspect ratios of printed lines have certain limits to avoid possible line collapse, the use of a thin photoresist has been widely accepted to give better resolution and a large depth of focus (DOF). Rayleigh's law can be used to define the pattern resolution and depth of focus (DOF).

$$\text{Resolution} = k_1 \lambda / NA; \text{ and}$$

$$DOF = k_2 \lambda / NA^2,$$

where $\lambda$ is the irradiation wavelength, NA is the numerical aperture of the exposure tool, and $k_1$ and $k_2$ are constants for a given process. Rayleigh's theory indicates that an exposure tool with short wavelength and large numerical aperture will produce better pattern resolution. This principle is why the microelectronics industry has been progressively moving toward short exposure wavelengths. However, Rayleigh's law also shows that enhancing resolution causes the DOF to decrease. The use of a thin photoresist decreases the value of $k_1$ and increases the value of $k_2$, which results in better resolution and a large DOF. However, the reduced photoresist thickness cannot offer sufficient etch resistance to transfer the pattern into the substrate, especially for 193-nm ArF photolithography. Due to the transparency requirement, aromatic structures cannot be put into ArF resists, so most ArF resists etch even faster than previous photoresists. To solve this conflict between the need for ever-thinner photoresists for better resolution and the need for a sufficient etch budget for pattern transfer, only a few process and material solutions currently exist.

In one approach, silicon-containing hardmasks have been introduced into a multilayer etch stack to help provide a complete pattern transfer. Within a traditional trilayer process, the photoresist is coated on top of a film stack consisting of a thin silicon-containing layer on top of a thick carbon-rich layer. The alternating stack allows for selective etching between layers. A thick carbon-rich layer is typically used in order to provide the needed etch budget to create deep features in the substrate. The silicon hardmasks utilized within this scheme are usually applied using chemical vapor deposition or spin-casting. One of their drawbacks is the difficulty of obtaining sufficient lithographic performance for high-volume manufacturing. To circumvent this problem, silicon hardmask materials are often heated to high temperatures to facilitate densification of the film. A catalyst can also be added to the silicon hardmask formulation to lower the required baking temperature. Reactive ion etching (RIE) is typically used to open the hardmask layer under the photoresist. The hardmask-to-photoresist etch selectivity determines how thin the photoresist can be. Unfortunately, almost all currently-available photoresists still etch relatively rapidly under common hardmask plasma etch chemistries, and silicon hardmasks do not provide sufficient etch selectivity for thinner photoresists. Thus, the photoresist still must be substantially thick for high-resolution lithography.

Another solution is to use a developer-soluble underlayer material to eliminate the otherwise required etch step. Isotropically developable and photosensitive bottom anti-reflective coatings have been described. However, undercutting is very difficult to control in an isotropically developable bottom anti-reflective coating. For a photosensitive, anisotropically developable bottom anti-reflective coating, a major concern is bottom anti-reflective coating clearance and CD uniformity when it is coated on substrate topography. On the other hand, if they are coated on top of a spin-on carbon, planarization layer, those organic bottom anti-reflective coating materials are not effective as hardmasks.

More recently, multiple exposure technology for the next printing node has become the only viable option until exposure wavelengths shorter than 193 nm, such as 13.5 nm, are available. Many process schemes for multiple exposure technology have been investigated and reported. Some schemes utilized a bright field mask where only small portions of the photoresist, such as lines, are protected from the exposure, while the remaining portion of the resist is exposed. The photoresist is then contacted with developer to remove the exposed portions of the resist, thereby leaving only the unexposed portion of the photoresist (i.e., the lines) remaining above the hardmask layer. The pattern is transferred to the hardmask by etching away the hardmask layer except for those areas underneath the unexposed portions of the photoresist. The process is repeated until the desired pattern is achieved. In a dark field exposure process, a large portion of the photoresist is protected from exposure, while only the small portions of the photoresist are exposed and removed after development. As with bright field, the pattern must then be transferred to the hardmask using an etching process.

Thus, there is still a need in the art for improved hardmask materials that can provide much higher RIE selectivities compared to standard silicon oxide films, which would allow for thinner films and new process schemes that would not be possible with silicon alone. A hardmask with a sufficient etch selectivity could also eliminate the need for the spin-on carbon layer all together. There is also a need for hardmask materials which, in conjunction with spin-on-carbon layers, provide better reflectivity control than traditional anti-reflective coatings and potentially eliminate the need for such coatings in the multi-layer stack.

SUMMARY OF THE INVENTION

The present invention overcomes these problems by broadly providing compositions for use in forming microelectronic structures, methods of forming such structures, and the structures thereof. The invention provides a hardmask composition comprising a metal-oxide precursor compound dispersed or dissolved in a solvent system and being substantially free of silicon, wherein the precursor compound is selected from the group consisting of polymers, oligomers, monomers, and mixtures thereof. The polymers and oligomers comprise recurring monomeric units of:

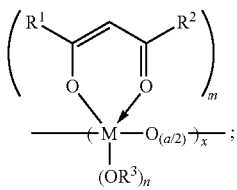

and
the monomers have the formula:

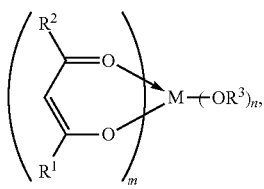

where: m is at least 1; each n is individually 1-3; a is the number of atoms making up all oxide linkages; x denotes the monomeric repeat unit; M is a metal or metalloid other than silicon; each $R^1$ and $R^2$ is individually selected from the group consisting of hydrogen, alkyls, aryls, alkoxys, phenoxys, and acetoxys; and each $R^3$ is individually selected from the group consisting of alkyls and carbonyls.

The invention also provides a hardmask composition that is insoluble in aqueous alkaline developers and comprises a metal-oxide precursor compound dispersed or dissolved in a solvent system, and further comprises silicon, wherein the precursor compound is selected from the group consisting of polymers, oligomers, monomers, and mixtures thereof. The polymers and oligomers comprise recurring monomeric units of:

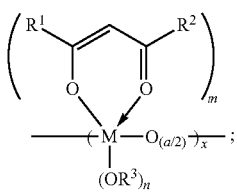

and
the monomers have the formula:

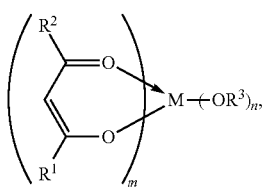

where: each m is at least 2; each n is individually 1-3; a is the number of atoms making up all oxide linkages; x denotes the monomeric repeat unit; M is a metal or metalloid other than silicon; each $R^1$ and $R^2$ is individually selected from the group consisting of hydrogen, alkyls, aryls, alkoxys, phenoxys, and acetoxys; and each $R^3$ is individually selected from the group consisting of alkyls and carbonyls.

A method of forming a microelectronic structure is also provided. The method comprises providing a substrate having a surface; optionally forming one or more intermediate layers on the surface; applying a hardmask composition adjacent the intermediate layers, if present, or adjacent the substrate surface if no intermediate layers are present to form a stack; and heating the hardmask composition to at least about 205° C. to yield a cured hardmask layer comprising a metal oxide film, wherein the cured hardmask layer is insoluble in aqueous alkaline developers. The hardmask composition comprises a metal-oxide precursor compound dissolved or dispersed in a solvent system, and is substantially free of silicon. The precursor compound is selected from the group consisting of polymers, oligomers, monomers, and mixtures thereof.

A further method of forming a microelectronic structure is also provided. The method comprises providing a substrate having a surface; optionally forming one or more intermediate layers on the surface; applying a hardmask composition adjacent the intermediate layers, if present, or adjacent the substrate surface if no intermediate layers are present to form a stack; and heating the hardmask composition to yield a cured hardmask layer comprising a metal oxide film, wherein the cured hardmask layer is insoluble in aqueous alkaline developers. The hardmask composition comprises a metal-oxide precursor compound dissolved or dispersed in a solvent system, and further comprises silicon. The precursor compound is selected from the group consisting of polymers, oligomers, monomers, and mixtures thereof, wherein the polymers and oligomers comprise recurring monomeric units of:

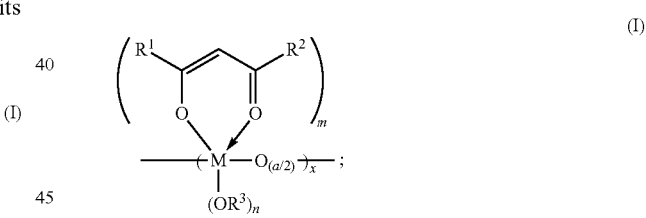

and
the monomers have the formula:

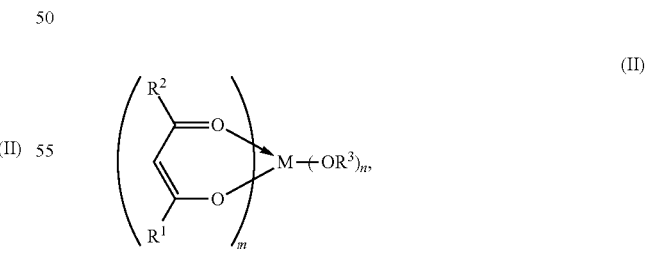

where: each m is at least 2; each n is individually 1-3; a is the number of atoms making up all oxide linkages; x denotes the monomeric repeat unit; M is a metal or metalloid other than silicon; each $R^1$ and $R^2$ is individually selected from the group consisting of hydrogen, alkyls, aryls, alkoxys, phenoxys, and acetoxys; and each $R^3$ is individually selected from the group consisting of alkyls and carbonyls.

A microelectronic structure is also provided. The structure comprises a substrate having a surface; one or more optional intermediate layers adjacent the substrate surface; and a cured hardmask layer adjacent the intermediate layers if present, or adjacent the substrate surface when no intermediate layers are present. The cured hardmask layer is insoluble in aqueous alkaline developers, and is formed from a hardmask composition comprising a metal-oxide precursor compound dispersed or dissolved in a solvent system, and being substantially free of silicon. The precursor compound is selected from the group consisting of polymers, oligomers, monomers, and mixtures thereof, wherein the polymers and oligomers comprise recurring monomeric units of:

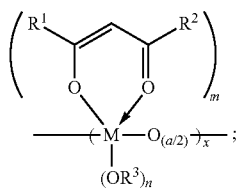

(I)

and
the monomers have the formula:

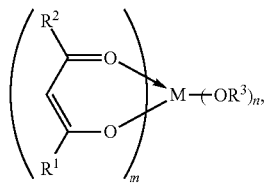

(II)

where: m is at least 1; each n is individually 1-3; a is the number of atoms making up all oxide linkages; x denotes the monomeric repeat unit; M is a metal or metalloid other than silicon; each $R^1$ and $R^2$ is individually selected from the group consisting of hydrogen, alkyls, aryls, alkoxys, phenoxys, and acetoxys; and each $R^3$ is individually selected from the group consisting of alkyls, phenyls, and carbonyls.

A further microelectronic structure is also provided. The structure comprises a substrate having a surface; one or more optional intermediate layers adjacent the substrate surface; and a cured hardmask layer adjacent the intermediate layers if present, or adjacent said substrate surface when no intermediate layers are present. The cured hardmask layer is insoluble in aqueous alkaline developers, and is formed from a hardmask composition comprising a metal-oxide precursor compound dispersed or dissolved in a solvent system, and further comprising silicon. The precursor compound is selected from the group consisting of polymers, oligomers, monomers, and mixtures thereof, wherein the polymers and oligomers comprise recurring monomeric units of:

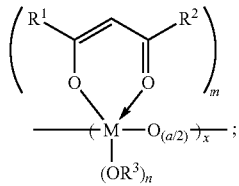

(I)

and
the monomers have the formula:

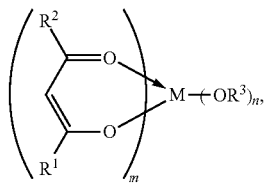

(II)

where: m is at least 1; each n is individually 1-3; a is the number of atoms making up all oxide linkages; x denotes the monomeric repeat unit; M is a metal or metalloid other than silicon; each $R^1$ and $R^2$ is individually selected from the group consisting of hydrogen, alkyls, aryls, alkoxys, phenoxys, and acetoxys; and each $R^3$ is individually selected from the group consisting of alkyls and carbonyls.

DETAILED DESCRIPTION OF THE INVENTION

Compositions for Use in the Invention

Figure 1:
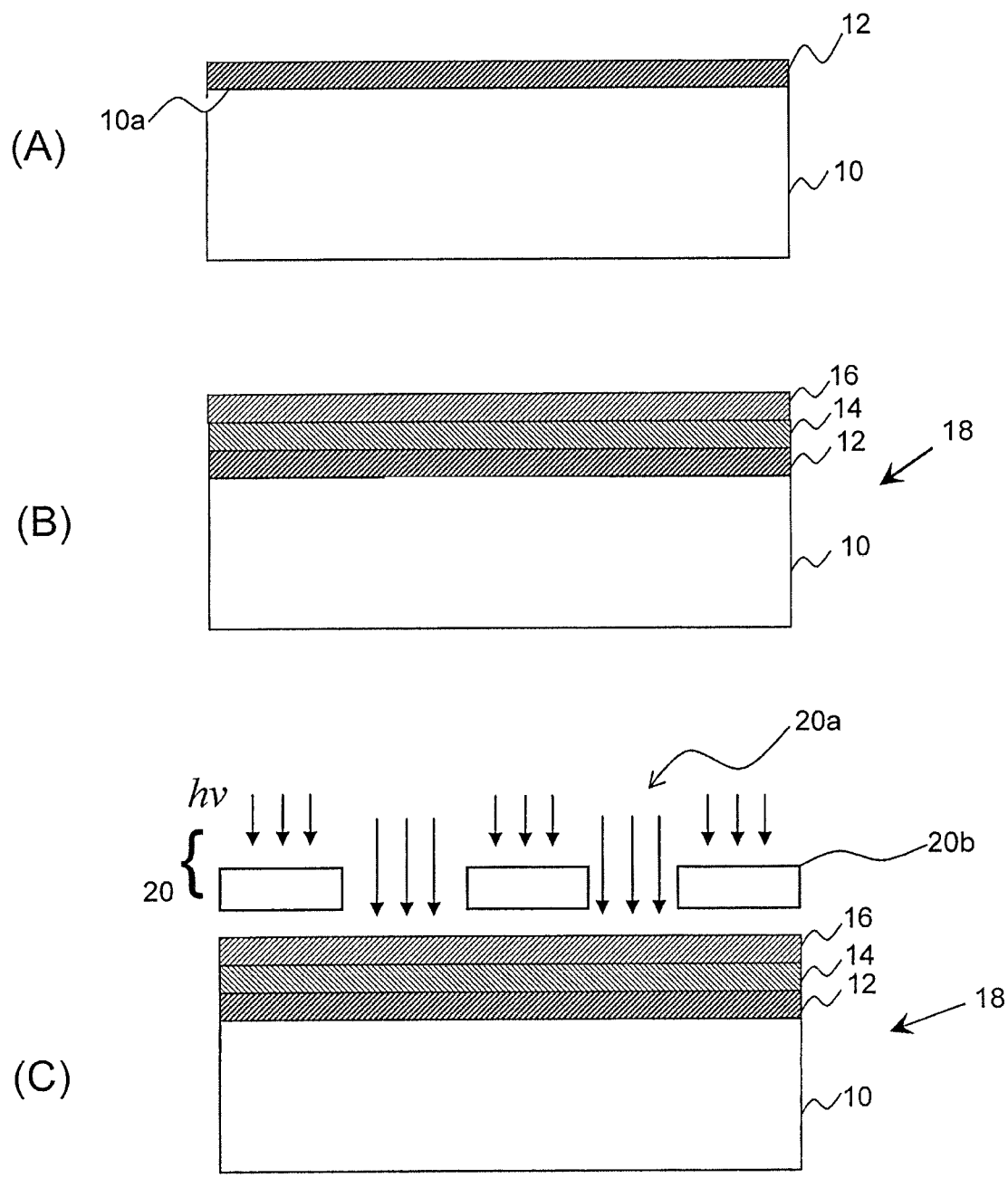
FIGS. 1(A)-(G) are schematic drawings depicting a structure (not to scale) formed by the inventive process.
Figure 1:
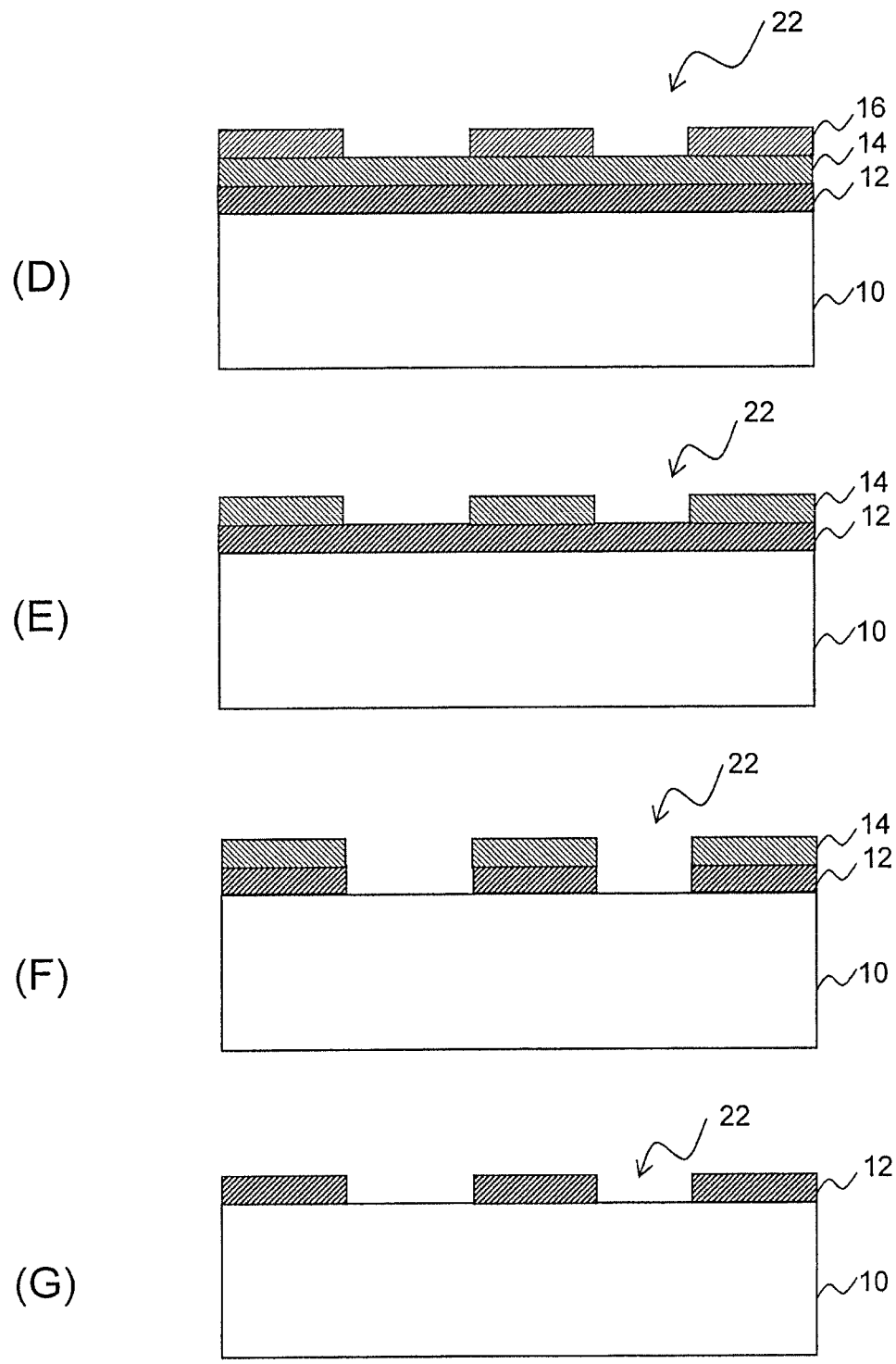

The inventive compositions comprise a metal-oxide precursor dissolved or dispersed in a solvent system. The metal-oxide precursor comprises a precursor compound selected from the group consisting of monomers, oligomers, polymers, and mixtures thereof, where, as used herein, sol-gel materials and nanoparticles are considered polymeric. Preferred precursor compounds for use in the compositions include organometallic monomers and/or oligomeric or polymeric compounds containing organometallic monomeric repeat units that can be converted to a metal oxide film in the presence of heat. Metal or metalloid alkoxides and diketonates are particularly preferred precursor compounds. Preferred metals and metalloids for use in the composition include aluminum, titanium, zirconium, vanadium, germanium, aluminum, hafnium, gallium, thallium, antimony, lead, bismuth, indium, tin, boron, germanium, arsenic, tellurium, rare earth metals (e.g., scandium, yttrium, and the lanthanides), or a combination thereof. The terms "metal" or "metalloid," as used herein, do not encompass silicon. Mixtures of various metal monomers, metal polymers, and/or mixed metal sol-gels, are particularly preferred for use in some embodiments of the compositions. Silicon monomers or silicon-containing monomeric repeat units can also be included in the precursor compound or composition along with the metal monomers, oligomers, and/or polymers. However, although silicon can be present in the composition, it is preferred that the metal-oxide precursor comprises at least one metal or metalloid that is not silicon.

Particularly preferred metal or metalloid polymers or oligomers for use in the invention can comprise, consist essentially, or even consist of recurring monomeric repeat

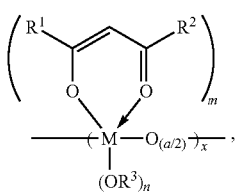

(I)

where: m is at least 1 (preferably 1-2, and in some embodiments preferably at least 2); n is 1-3 (preferably 2-3); a is the number of atoms making up all oxide linkages (preferably 2-4); x denotes the monomeric repeat unit without regard to distribution or position in the backbone; M is a metal or metalloid (and not silicon); each $R^1$ and $R^2$ is individually selected from the group consisting of hydrogen, alkyls (preferably $C_1$-$C_8$ alkyls), aryls, alkoxys, phenoxys, and acetoxys; and each $R^3$ is individually selected from the group consisting of alkyls (preferably $C_1$-$C_8$ alkyls), phenyls, and carbonyls. The polymeric or oligomeric precursors used in the invention are preferably low molecular weight precursor compounds. Thus, the polymeric or oligomeric metal-oxide precursors preferably have a weight average molecular weight of from about 1,000 Daltons to about 10,000 Daltons, more preferably from about 1,500 Daltons to about 7,500 Daltons, and even more preferably from about 1,500 Daltons to about 5,000 Daltons. The polymeric or oligomeric metal-oxide precursor, when present, should be utilized in the composition at a level of from about 0.1% to about 5% by weight, preferably from about 0.3% to about 5% by weight, more preferably from about 0.5% to about 2.5% by weight, and even more preferably from about 0.5% to about 2% by weight, based upon the total weight of the composition taken as 100% by weight.

Preferred metal or metalloid monomers for use in the compositions (alone or in combination with the above polymers or oligomers) include monomers having the formula:

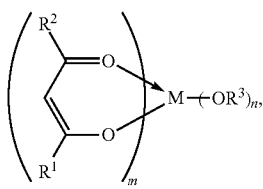

(II)

where: m is at least 1 (and preferably at least 2); n is 1-3; M is a metal or metalloid (and is not silicon); each $R^1$ and $R^2$ is individually selected from the group consisting of hydrogen, alkyls (preferably $C_1$-$C_8$ alkyls), aryls, alkoxys, phenoxys, and acetoxys; and each $R^3$ is individually selected from the group consisting of alkyls, phenyls, and carbonyls. Metal or metalloid (i.e., non-silicon-containing) monomers, when present, are preferably utilized in the composition at a level of from about 0.1% to about 5% by weight, preferably from about 0.3% to about 5% by weight, more preferably from about 0.5% to about 2.5% by weight, and even more preferably from about 0.5% to about 2% by weight, based upon the total weight of the composition taken as 100% by weight.

Preferred metals or metalloids (M) for use in the polymers, oligomers, or monomers of the invention are individually selected from the group consisting of aluminum, titanium, zirconium, vanadium, germanium, aluminum, hafnium, gallium, thallium, antimony, lead, bismuth, indium, tin, boron, germanium, arsenic, tellurium, and rare earth metals.

In some embodiments, the precursor compound or inventive composition further comprises silicon. The silicon can be present in the composition as a polymer, oligomer, monomer, or a mixture thereof. The silicon can also be present as a co-monomer in the precursor compound. When silicon is present as a co-monomer, the precursor compound preferably comprises from about 5% to about 40% by weight silicon, more preferably from about 10% to about 35% by weight silicon, and even more preferably from about 15% to about 30% by weight silicon, based upon the total weight of the precursor compound taken as 100% by weight. Preferred silicon monomeric repeat units for use in the invention (whether as a co-monomer or in a separate polymer from the precursor compound) will have the formula:

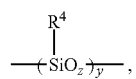

(III)

where: y denotes the monomeric repeat unit without regard to distribution or position in the backbone and is 5-100 (preferably 10-50); z is 0-1 (preferably 1), and each $R^4$ is individually selected from the group consisting of phenyls, alkyls (preferably $C_1$ to $C_8$ alkyls), hydrogen, alkenyls, and alkynyls. In embodiments where the polymer or oligomer comprises recurring co-monomers of both formulas (I) and (III), the ratio of x:y is preferably from about 10:1 to about 1:10, more preferably from about 10:1 to about 1:5, and even more preferably from about 10:1 to about 1:2.

Preferred silicon monomers for use in the invention are selected from the group consisting of $Si(OR^3)_n(R^4)_m$, $Si(Cl)_n(R^4)_m$, and combinations thereof, where n is 2-4 (preferably 3-4), m is 0-2 (preferably 0-1, and more preferably 1), each $R^3$ is individually selected from the group consisting of alkyls (preferably $C_1$ to $C_8$ alkyls), phenyls, and siloxyls, and each $R^4$ is individually selected from the group consisting of phenyls, alkyls (preferably $C_1$ to $C_8$ alkyls), hydrogen, alkenyls, alkynyls, naphthyls, silyls, and pyridyls.

When present, the composition preferably comprises from about 0.025% to about 10% by weight silicon, more preferably from about 0.025% to about 5% by weight silicon, and even more preferably from about 0.025% to about 2% by weight silicon, based upon the total weight of the composition taken as 100% by weight. In general, the ratio of silicon-containing compounds (when present) to metal or metalloid compounds in the inventive hardmask compositions is preferably from about 10:1 to about 1:10, more preferably from about 10:1 to about 1:5, and even more preferably from about 10:1 to about 1:2. In certain embodiments, the total silicon content of the precursor compound or composition is preferably greater than about 25% by weight, more preferably greater than about 50% by weight, and even more preferably greater than about 65% by weight, based upon the total weight of metals or metalloids and silicon in the precursor compound or composition taken as 100% by weight. In other embodiments, the precursor compound is preferably substantially free of silicon (i.e., less than about 5% by weight silicon, more preferably less than about 3% by weight silicon, even more preferably less than about 1% by weight silicon, and most preferably about 0% by weight silicon, based upon the total weight of the precursor compound taken as 100% by weight). In some embodiments, the composition is preferably substantially free of silicon (i.e., less than about 0.025% by weight silicon, more preferably less than about 0.01% by weight silicon, and even more preferably about 0% by weight silicon, based upon the total weight of the composition taken as 100% by weight).

The compositions can comprise a mixture of: (a) precursor compounds comprising the above monomers; and (b) precursor compounds comprising recurring monomeric units described above (i.e., the compositions can comprise a mixture of any of the foregoing monomers, polymers, or oligomers in any combination). For example, a silicon-containing polymer (such as formula III above) can be mixed with a metal-oxide precursor monomer (such as formula II above). Likewise, metal or metalloid polymers (such as formula I above) can be mixed with silicon monomers. Alternatively, silicon co-monomers can be included in the metal or metalloid polymers and oligomers, as mentioned above. The composition can also comprise a mixture of primarily metal or metalloid monomers or primarily metal or metalloid polymers and/or oligomers.

Monomeric precursors can be formed by reacting a metal or metalloid compound with a selected ligand. Higher molecular weight precursors (e.g., polymers or oligomers) can be formed by either the use of multifunctional ligands or the synthesis of sol-gel polymers. For example, a starting monomer which already includes the diketo- or alkoxide ligand as part of its structure can be formed into the desired precursor compound by hydrolyzing and then condensing the monomer to form colloid-like oligomers or polymers (sol formation). One example of this type of starting monomer is a metal (e.g., titanium, aluminum, etc.) diisopropoxide bis (ethylacetoacetate).

Suitable ligands for use in the hardmask materials include those selected from the group consisting of alcohols (alkoxides), phenols (phenoxides), beta-diketones, beta-diketoesters, aromatic or aliphatic carboxylic acids (carboxylates), thiols, and derivatives thereof. The ligands may also contain an additional functional group that allows for other chemical reactions to occur, such as an acrylate that can be polymerized. Particularly preferred ligands include acetoacetates, pentanedionates, and alkoxides. If silicon is present in the precursor compound, it is preferred that the silicon be substantially free of ligands. That is, the ligands are preferably only bonded with the metals or metalloids, and not to the silicon.

In a further embodiment, the precursor compound can be in the form of metal-oxide nanoparticles or nanoclusters, which are considered polymeric herein. In this embodiment, the precursor compound is of the same general formulas described above, but in nanoparticle form, and further comprises pendant groups such as carboxylic acids, alkoxides, acetoacetals, and pentanedionates.

Regardless of the embodiment, the hardmask composition is formed by dissolving or dispersing the metal-oxide precursor and other ingredients in a solvent system. As discussed above, the compositions can comprise monomers, oligomers, polymers, or a mixture thereof, and are preferably suitable for sol-gel processes. For example, the sol (polymer) can be prepared ahead of time via polycondensation and then dispersed or dissolved in a solvent system to form the composition. Alternatively, the sol can be prepared and dispersed or dissolved in the solvent system along with organometallic monomers to form the hardmask composition. In other aspects, the composition can comprise primarily monomers (i.e., includes less than about 10% by weight polymeric or oligomeric compounds). However, after coating and baking, as discussed below, all of the compositions preferably transition to the gel. Thus, in monomeric hardmask compositions, the monomers can be converted directly to metal oxides ("on-wafer polymerization") in the presence of heat and optional addition of a catalyst.

Suitable solvent systems for use in forming the hardmask composition will include a solvent selected from the group consisting of propylene glycol methyl ether acetate (PGMEA), propylene glycol monomethyl ether (PGME), ethyl lactate, propylene glycol n-propyl ether, gamma-butyrolactone, cyclopentanone, cyclohexanone, n-butyl acetate, and mixtures thereof. Preferably, the solvent system has a boiling point of from about 90 about 220° C., and more preferably from about 90 to about 180° C. The solvent system should be utilized at a level of from about 50% to about 99.7% by weight, preferably from about 90% to about 99.5% by weight, and more preferably from about 95% to about 99.5% by weight, based upon the total weight of the composition taken as 100% by weight. The total solids in the composition preferably range from about 0.3% to about 50%, more preferably from about 0.3% to about 10%, and even more preferably from about 0.5% to about 5%, based upon the total weight of the composition taken as 100% by weight.

In some embodiments, the hardmask composition consists essentially (or even consists) of the metal-oxide precursor and optional silicon-containing compounds dispersed or dissolved in the solvent system, and is free of other ingredients. However, in other embodiments, additional ingredients can optionally be included in the composition, such as additional polymers, sol-gel materials, catalysts, chromophores (light attenuating moieties), crosslinkers, and combinations thereof. Preferred catalysts are selected from the group consisting of quaternary ammonium salts and phosphonium salts. When present, the composition preferably comprises from about 0.01% to about 2% by weight catalyst, preferably from about 0.1% to about 1% by weight catalyst, and more preferably from about 0.1% to about 0.5% by weight catalyst, based upon the total weight of the composition taken as 100% by weight.

Chromophores that can be included in the composition or precursor compound include moieties selected from the group consisting of phenyls, vinyls, naphthyls, pyridyls, and silyls. In such embodiments, the chromophore is preferably added to the silicon-containing monomer or monomeric repeat unit. That is, the metal or metalloid precursor monomers or repeat units are preferably substantially free of added chromophores or light attenuating moieties. When present, the composition preferably comprises from about 10% to about 60% by weight chromophore, preferably from about 10% to about 50% by weight chromophore, and more preferably from about 10% to about 40% by weight chromophore, based upon the total weight of the composition taken as 100% by weight. In other embodiments, the composition or precursor compound is preferably substantially free of added chromophores or light attenuating moieties (i.e., less than about 10% by weight, and more preferably less than about 5% by weight added chromophores or light attenuating moieties, based upon the total weight of the precursor compound or composition, taken as 100% by weight).

It will be appreciated that this invention provides a distinct advantage in that the use of an additional crosslinking agent is not necessary. That is, the metal-oxide precursor provides the necessary curing and/or crosslinking in and of itself. The hardmask composition preferably comprises less than about 20% by weight crosslinking agent, more preferably less than about 10% by weight crosslinking agent, more preferably less than about 1% by weight crosslinking agent based upon the total weight of the solids taken as 100% by weight, and even more preferably is substantially free of crosslinking agents.

The term "crosslinking agents" is used herein interchangeably with "crosslinker" and includes aminoplasts, cresols, epoxies, polyols, anhydrides, glycidyl ethers, vinyl ethers, melamines, glycolurils, benzoguanamines, and mixtures thereof.

The Inventive Methods and Structures

FIGS. 1(A)-1(G) illustrate the formation of a multi-layer stack and processing using the inventive hardmask composition. In the method, a substrate 10 having a surface 10a is provided. Any microelectronic substrate can be used in the invention. Exemplary substrates 10 include those selected from the group consisting of silicon, SiGe, $SiO_2$, $Si_3N_4$, SiON, aluminum, tungsten, tungsten silicide, gallium arsenide, germanium, tantalum, tantalum nitride, coral, black diamond, phosphorous or boron doped glass, and mixtures of the foregoing. An intermediate layer 12 is optionally formed on the surface 10a of the substrate as depicted in FIG. 1(A). The intermediate layer 12 can be formed by any known application method, with one preferred method being spin-coating the composition at speeds of from about 1,000 to about 3,000 rpm (preferably from about from about 1,250 to about 1,750 rpm) for a time period of from about 30 to about 120 seconds (preferably from about 45 to about 75 seconds). Suitable intermediate layers include those selected from the group consisting of spin-on carbon layers, amorphous carbon layers, bottom anti-reflective coatings, planarization layers, and combinations of the foregoing. When spin-on carbon layers are used, the intermediate layer 12 preferably has a thickness of from about 100 nm to about 500 nm, more preferably from about 100 nm to about 300 nm, and even more preferably from about 100 nm to about 200 nm. Regardless, the substrate 10 can comprise a planar surface, or it can include topography (via holes, contact holes, raised features, etc.). As used herein, "topography" refers to the height or depth of a structure in or on a substrate surface.

The hardmask composition is then applied to the intermediate layer 12, when present, to form a hardmask layer 14, as shown in FIG. 1(B). When no intermediate layer 12 is used, the hardmask composition is applied directly to the substrate surface 10a (not shown). The hardmask layer 14 can be formed by any known application method, with one preferred method being spin-coating the composition at speeds of from about 1,000 to about 3,000 rpm (preferably from about from about 1,250 to about 1,750 rpm) for a time period of from about 30 to about 120 seconds (preferably from about 45 to about 75 seconds). After the hardmask composition is applied, it is preferably heated to a temperature of from about 140° C. to about 240° C., and more preferably from about 180° C. to about 240° C. and for time periods of from about 30 seconds to about 300 seconds (preferably from about 30 seconds to about 120 seconds) to form a cured hardmask layer 14. Alternatively, the hardmask composition can be heated to a temperature of at least about 205° C. and preferably from about 205° C. to about 240° C., for time periods of from about 30 seconds to about 300 seconds (preferably from about 30 seconds to about 120 seconds) to form a cured hardmask layer 14. In some embodiments, the metal-oxide precursor compounds in the hardmask composition include monomers that will polymerize during curing to form the metal oxide film 14 (i.e., "on-wafer polymerization"). In other embodiments, the metal-oxide precursor compounds include monomers and polymers that are self-condensing and crosslink during heating to form a crosslinked metal oxide layer 14, without an additional crosslinking agent. In yet a further embodiment, the metal-oxide precursor compounds self-crosslink via their ligands during heating. Regardless of the embodiment, the thickness of the hardmask layer 14 after baking is preferably from about 10 nm to about 100 nm, more preferably from about 15 nm to about 75 nm, and even more preferably from about 15 nm to about 60 nm.

In embodiments comprising silicon monomers, the silicon monomers will be present in the cured hardmask layer 14 at a level of from about 20% to about 90% by weight, preferably from about 40% to about 90% by weight, and more preferably from about 50% to about 90% by weight, based upon the total weight of the cured layer taken as 100% by weight. In other embodiments when silicon is present in the composition, and the total silicon content in the cured hardmask layer 14 is preferably from about 5% to about 40% by weight, more preferably from about 5% to about 35% by weight, and even more preferably from about 5% to about 30% by weight, based upon the total weight of the cured layer taken as 100% by weight.

The hardmask layer 14 preferably possesses light absorbing properties. Specifically, the hardmask layer 14 used in the inventive methods will preferably have a k value (the imaginary component (extinction coefficient) of the complex index of refraction) of at least about 0.1, preferably from about 0.15 to about 0.6, and more preferably from about 0.15 to about 0.4, and an n value (the real component of the complex index of refraction) of at least about 1.5, and preferably from about 1.5 to about 2, and more preferably from about 1.5 to about 1.8. These values can be obtained at a wide range of wavelengths, including wavelengths of less than about 500 nm (e.g., 365 nm, 248 nm, 193 nm, 157 nm, or 13.5 nm).

Advantageously, the cured hardmask layer 14 will be sufficiently cured that it will be substantially insoluble in solvents used to form the hardmask compositions such as PGMEA, PGME, ethyl lactate, propylene glycol n-propyl ether, gamma-butyrolactone, cyclopentanone, cyclohexanone, n-butyl acetate, and mixtures thereof. Thus, when subjected to a stripping test, the cured hardmask layer 14 will have a percent stripping of less than about 5%, preferably less than about 1%, and even more preferably about 0%. The stripping test involves first determining the thickness by taking the average of measurements at five different locations of the cured layer. This is the initial average film thickness. Next, the film is rinsed with a solvent (e.g., ethyl lactate) for about 30 seconds, followed by spin drying at about 500-3,000 rpm for about 20-60 seconds to remove the solvent. The thickness is measured again at five different points on the wafer using ellipsometry, and the average of these measurements is determined. This is the average final film thickness.

The amount of stripping is the difference between the initial and final average film thicknesses. The percent stripping is:

$$\% \text{ stripping} = \left(\frac{\text{amount of stripping}}{\text{initial average film thickness}}\right) \times 100.$$

Preferably, the hardmask layer 14 is not photosensitive. That is, the layer 14 does not undergo any physical or chemical change during exposure to radiation (i.e., light). It is preferred that the hardmask layer 14 be substantially insoluble in aqueous alkaline developers such as tetramethyl ammonium hydroxide (TMAH) and potassium hydroxide (KOH). That is, the inventive compositions are preferably not wet developable, and cannot be removed with conventional aqueous developers. More preferably, less than about 5% and more preferably less than about 2% of the inventive coatings will be removed by a base developer such as tetramethyl ammonium hydroxide or KOH developer.

A photosensitive composition can then be applied to the cured hardmask layer 14 to form an imaging layer 16. The resulting stack 18 is shown in FIG. 1(B). The imaging layer 16 is then post-application baked at a temperature of at least about 90° C., and preferably from about 90° C. to about 130° C., for time periods of from about 30 seconds to about 120 seconds. Suitable imaging compositions include commercially-available photoresists (e.g., TArF Pi6-001, TOK, Kawasaki shi, Kanagawa (Japan); ARX3001, JSR Micro, Sunnyvale, Calif.; AM2073J, JSR Micro), or any other photosensitive compositions. The inventive hardmask layer 14 permits the use of much thinner imaging layers 16. The thickness of the imaging layer 16 is less than about 240 nm, preferably from about 50 nm to about 200 nm, and more preferably from about 70 nm to about 130 nm.

As shown in FIG. 1(C), the imaging layer 16 can then be patterned by exposure to light of the appropriate wavelength followed by development of the exposed layer. More specifically, the imaging layer 16 is exposed using a mask 20 positioned above the imaging layer 16. The mask 20 has open areas 20a designed to permit radiation (hv) to pass through the mask 20 and contact the imaging layer 16. The remaining solid portions 20b of the mask 20 are designed to prevent radiation from contacting the imaging layer 16 in certain areas. Those skilled in the art will readily understand that the arrangement of open areas 20a and solid portions 20b is designed based upon the desired pattern to be formed in the imaging layer 16 and ultimately in the substrate 10. Although an anti-reflective layer can be present in the stack 18, in a preferred embodiment, the intermediate layer 12 comprises an SOC layer, and the stack 18 is free of an anti-reflective layer. That is, in this embodiment, the hardmask layer 14 and SOC intermediate layer 12 advantageously eliminate the need for an anti-reflective layer in the stack to control reflection during the exposure process. Regardless of the embodiment, after exposure, the imaging layer 16 is preferably subjected to a post-exposure bake at a temperature of from about 90° C. to about 150° C., more preferably from about 110° C. to about 130° C., for a time period of from about 30 seconds to about 120 seconds.

Upon exposure, the portions of the imaging layer 16 that are exposed to radiation are rendered soluble in aqueous developer. As shown in FIG. 1(D), the exposed portions of the imaging layer 16 which were made soluble by the above process, are then contacted with an aqueous developer to remove the exposed portions to form the desired pattern 22 in the imaging layer 16. The pattern 22 can be via holes, trenches, lines, spaces, etc., that will ultimately be transferred to the substrate 10 using an etch or ion implantation process. Alternatively, the exposed portions of the imaging layer 16 can be rendered insoluble during the exposure process, in which case, the removal process is reversed from what is described above. That is, the unexposed portions are removed during development to form the pattern (not shown). In either embodiment, at least about 95% of the exposed (or unexposed as the case may be) portions of the imaging layer 16 will preferably be removed by the developer, more preferably at least about 99%, and even more preferably about 100% will be removed. Suitable developers are organic or inorganic alkaline solutions such as KOH or TMAH, and preferably comprise an aqueous solution of TMAH at a concentration of 0.26N or lower. Some of these developers are commercialized under the tradenames PD523AD (available from Moses Lake Industries, Inc., Moses Lake, Wash.), MF-319 (available from Shipley, Mass.), MF-320 (available from Shipley), and NMD3 (available from TOK, Japan).

An etching process is then used to transfer the pattern 22 from the imaging layer 16 into the hardmask layer 14, as shown in FIG. 1(E). Preferably, RIE is used to transfer the pattern 22 using a reactive ion plasma of $CF_4$, $O_2$, HBr, $Cl_2$, $SF_5$, $C_2F_6$, $C_4F_8$, $CO_2$, $N_2$, $H_2$, $C_4H_8$, or a mixture thereof. The hardmask layer 14 preferably has an etch rate of at least about 60 Å/min., and more preferably from about 60 Å/min to about 600 Å/min., when $CF_4$ is the etchant. Thus, the etch selectivity of the hardmask layer 14 over the imaging layer (e.g., a 60-nm photoresist) will be at least about 1:1, preferably at least about 1:2, and more preferably from about 1:3 to about 1:6, when $CF_4$ is used as the etchant. The hardmask layer 14 is then used to etch the pattern 22 into the intermediate layer 12, when present, or the substrate 10. The hardmask layer 14 should also have a high etch selectivity over the intermediate layer 12, when present. Advantageously, the hardmask layer 14 is resistant to etching with $O_2$, and preferably etches at a rate of less than about 50 Å/min., more preferably less than about 30 Å/min., and even more preferably less than about 20 Å/min., when $O_2$ is used as the etchant. Thus, when the intermediate layer 12 is spin-on carbon, the etch selectivity of the hardmask layer 14 over the intermediate layer 12 will be at least about 5, preferably at least about 10, and more preferably from about 10 to about 50, when $O_2$ is used as the etchant.

After transferring the pattern 22 into the intermediate layer 12, as shown in FIG. 1(F), or to the substrate 10 (not shown), the hardmask layer 14 can be cleaned away using alkaline aqueous developers, if not fully cured, or by etching off or over-etching, as shown in FIG. 1(G). The intermediate layer 12, when present, is then used to transfer the pattern 22 into the substrate 10. Conventional etching, metallization, etc., can then be carried out on the patterned stack 24 to complete the device manufacture. The exposure-development process can also be repeated using a second imaging layer applied adjacent to the patterned hardmask layer 14 (formed in FIG. 1(E)) if a multiple exposure process is desired (not shown).

In an alternative embodiment, ArF immersion lithography (not shown) can be used to pattern the photoresist. Instead of air (as in conventional lithography), the medium through which the radiation passes during exposure is a liquid. The imaging layer 16 is exposed to radiation via an optical projection element (i.e., lens) of a lithographic system, with the immersion liquid contacting at least a portion of the optical element of the lithographic system and a portion of the structure (i.e., the stack 18). Even more preferably, the liquid fills the space between the last optical element in the system and the imaging layer 16, such that the optical element is immersed in the liquid. Suitable immersion liquids preferably have a refractive index greater than 1 (preferably from about 1 to about 2, and more preferably from about 1.3 to about 1.4), and are selected from the group consisting of water (preferably purified water), organic solvents, and mixtures thereof. Immersion lithography systems are known in the art and include the Amphibian Interferometer from Amphibian™ Systems (Rochester, N.Y.).

EXAMPLES

The following examples set forth preferred methods in accordance with the invention. It is to be understood, however, that these examples are provided by way of illustration and nothing therein should be taken as a limitation upon the overall scope of the invention.

Example 1

Aluminum/Silicon Sol-Gel Hardmask

1. Polymer Synthesis

To prepare the polymer, 1.32 grams of phenyl trimethoxysilane (Gelest; Morrisville, Pa.), 6.54 grams of vinyl trimethoxysilane (Gelest), 14.06 grams of methyl trimethoxysilane (Gelest), 45.11 grams of aluminum diisopropoxide ethylacetoacetate (solution of 75% solids in IPA from Gelest, diluted to 40% solids with PGMEA), and 93.00 grams of PGMEA (Ultra Pure Solutions, Inc.) were added to a round-bottom flask. Over a 10-minute period, 17.15 grams of a 3N acetic acid solution (17.6% acetic acid and 82.4% water) were added slowly to the flask while stirring. The round-bottom flask was fitted with a distillation head, distillation column, and collection flask. The solution was then heated at 95° C. for 3 hours.

2. Hardmask Formulation

A hardmask formulation was prepared by mixing 12.03 grams of the polymer solution above (~8.88% solids) with 6.36 grams of PGMEA, 16.4 grams of PGME, and 0.89 grams of a 0.4% solution of benzyltriethylamino chloride (BTEAC) in PGME to make a 3.0% solids solution by weight. The hardmask formulation was spin-coated onto a 4-inch silicon wafer at 1,500 rpm for 60 seconds followed by baking on a hotplate at 240° C. for 60 seconds. The resulting cured film was measured by ellipsometry to be 975 Å thick, and was insoluble in the casting solvents (i.e., could not be removed using the casting solvents). The optical properties and the etch rates of the film are shown in Table 1. For comparison, a traditional silicon hardmask (OptiStack® HM710; Brewer Science Inc.) was also spin-coated onto a 4-inch silicon wafer at 1,500 rpm for 60 seconds followed by baking on a hotplate at 205° C. for 60 seconds. The resulting cured film was measured by ellipsometry to be 930 Å thick. The etch rates of the silicon hardmask film are also shown in Table 1.

TABLE 1

| | n-value (193 nm) | k-value (193 nm) | n-value (248 nm) | k-value (248 nm) | $CF_4$ Å/min | $O_2$ Å/min | $Cl_2$ Å/min | HBr Å/min |
|---|---|---|---|---|---|---|---|---|
| Aluminum/Silicon Sol-gel Hardmask | 1.63 | 0.09 | 1.5 | 0 | 210 | 7.2 | 31.2 | −102 |
| Silicon Hardmask | — | — | — | — | 504 | 4.8 | 414 | 60 |

3. Hardmask Used as an Anti-Reflective Coating

Figure 2:
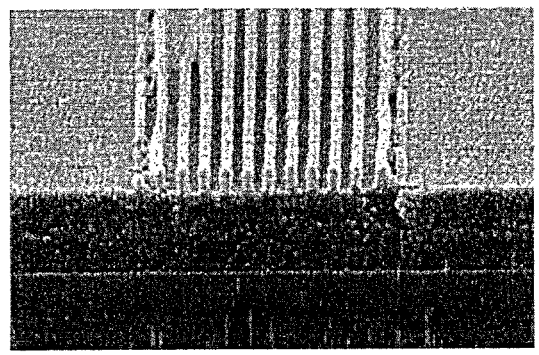
FIG. 2 is a scanning electron microscope (SEM) photograph of the patterns formed in Example 1.

The hardmask formulation prepared above was further diluted with 35 grams of PGMFA and 35.75 grams of PGME to produce a 1% solids solution by weight and reduce the film thickness to 350 Å. Next, 300-mm silicon wafers were spin-coated with a commercially available spin-on-carbon material (Brewer Science OptiStack® SOC110D) to a thickness of 320 nm and baked on a hotplate at 205° C. for 60 seconds. The diluted hardmask formulation was then spin-coated onto the spin-on-carbon layer and baked at 240° C. for 60 seconds. Finally, a 193-nm photoresist (TOK TArF Pi6-001) spin-coated to a thickness of 105 nm on top of the hardmask layer, and baked at 120° C. for 60 seconds. Lithography exposure was performed using an ASML XT:1900i stepper (1.35 NA) using water as the immersion fluid. The wafer was then post exposure baked at 110° C. for 60 seconds and developed by puddling with TMAH for 30 seconds, followed by a water rinse and spin dry. Scanning electron microscope images of the resulting 40-nm lines in the photoresist are shown in FIG. 2.

Example 2

Titanium/Silicon Sol-Gel Hardmask

1. Polymer Synthesis

In this Example, the polymer was prepared by adding 1.21 grams of phenyl trimethoxysilane (Gelest), 6.00 grams of vinyl trimethoxysilane (Gelest), 11.01 grams of methyl trimethoxysilane (Gelest), 68.06 grams of titanium diisopropoxide (bis 2,4-pentanedione) (solution of 75% solids in IPA from Gelest, diluted to 40% solids with PGMEA), and 80.50 grams of PGMEA (Ultra Pure Solutions, Inc.) to a round-bottom flask. Over a 10-minute period, 17.08 grams of a 3N acetic acid solution (17.6% acetic acid and 82.4% water) were slowly added to the flask while stirring. The round-bottom flask was fitted with a distillation head, distillation column, and collection flask. The solution was then heated at 95° C. for 4 hours.

2. Hardmask Formulation

A hardmask formulation was prepared by mixing 6.01 grams of the polymer solution above (9.06% solids) with 17.85 grams of PGMEA, and 12.39 grams of PGME to make a 1.5% solids solution by weight. The hardmask formulation was spin-coated onto a 4-inch silicon wafer at 1,500 rpm for 60 seconds followed by baking on a hotplate at 240° C. for 60 seconds. The resulting cured film was measured by ellipsometry to be 398 Å thick and was insoluble in the casting solvents. The optical properties and the etch rates of the film are shown in Table 2.

TABLE 2

| | n-value (193 nm) | k-value (193 nm) | n-value (248 nm) | k-value (248 nm) | $CF_4$ Å/min | $O_2$ Å/min | $Cl_2$ Å/min | HBr Å/min |
|---|---|---|---|---|---|---|---|---|
| Titanium/Silicon Sol-gel Hardmask | 1.67 | 0.30 | 1.67 | 0.20 | 210 | 1.8 | 204 | −54 |

3. Hardmask Used as an Anti-Reflective Coating

Figure 3:
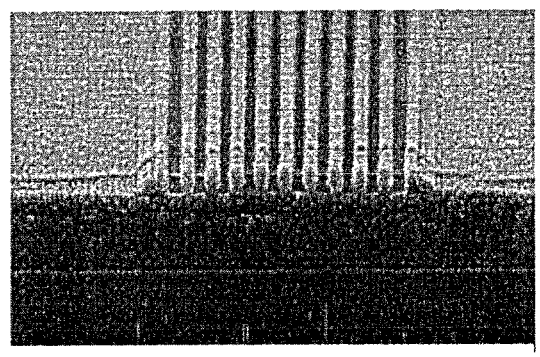
FIG. 3 is an SEM photograph of the patterns formed in Example 2.

The formulation above was further diluted with 2.81 grams of PGMEA and 2.81 grams of PGME to decrease the solids to 1.3% by weight, and reduce the film thickness to 350 Å. Next, 300-mm silicon wafers were first spin-coated with a commercially available spin-on-carbon material (OptiStack® SOC110D; Brewer Science Inc.) to a thickness of 320 nm, and baked on a hotplate at 205° C. for 60 seconds. The diluted hardmask formulation was then spin-coated onto the spin-on-carbon layer and baked at 240° C. for 60 seconds. Finally, a 193-nm photoresist (TOK TArF Pi6-001) was spin-coated onto the hardmask layer to a thickness of 105 nm, and baked at 120° C. for 60 seconds. Lithography exposure was performed using an ASML XT:1900i stepper (1.35 NA) using water as the immersion fluid. The wafer was then post-exposure baked at 110° C. for 60 seconds and developed by puddling with TMAH for 30 seconds, followed by a water rinse and spin dry. Scanning electron microscope images of the resulting 45-nm lines are shown in FIG. 3.

Example 3

Titanium/Silicon Sol-Gel Hardmask 2

1. Polymer Synthesis

In this procedure, as second titanium/silicon sol-gel hardmask was prepared. To synthesize the polymer, 21.11 grams of methyl trimethoxysilane (Gelest), 32.40 grams of titanium diisopropoxide (bis 2,4-pentanedione) (75% solids in IPA, Gelest), and 117.50 grams of PGMEA (Ultra Pure Solutions, Inc.) were added to a round-bottom flask. Over a 10-minute period, 5.75 grams of a 3N acetic acid solution (17.6% acetic acid and 82.4% water) were added slowly to the flask while stirring. The round-bottom flask was fitted with a distillation head, distillation column, and collection flask, and the solution was heated at 95° C. for 4 hours.

2. Hardmask Formulation

A hardmask formulation was prepared by mixing 6.00 grams of the polymer solution above (9.56% solids) with 19.03 grams of PGMEA, 3.05 grams of PGME, and 0.72 grams of a 0.4% solution of benzyltriethylamino chloride (BTEAC) in PGME to make a 2.0% solids solution by weight. The hardmask formulation was spin-coated onto a 4-inch silicon wafer at 1,500 rpm for 60 seconds, followed by baking on a hotplate at 240° C. for 60 seconds. The resulting cured film was measured by ellipsometry to be 572 Å thick and was insoluble in the casting solvents. The optical constants of the film are shown in Table 3.

TABLE 3

| | n-value (193 nm) | k-value (193 nm) | n-value (248 nm) | k-value (248 nm) |
|---|---|---|---|---|
| Titanium/Silicon Sol-gel Hardmask 2 | 1.55 | 0.14 | 1.57 | 0.11 |

Example 4

Titanium/Silicon Sol-Gel Hardmask 3

1. Polymer Synthesis

In this procedure, a third titanium/silicon sol-gel hardmask formulation was prepared. To synthesize the polymer, 6.89 grams of triethoxysilane (Gelest), 16.62 grams of methyl trimethoxysilane (Gelest), 32.30 grams of titanium diisopropoxide (bis 2,4-pentanedione) (75% solids in IPA, Gelest), and 80.50 grams of PGMEA (Ultra Pure Solutions, Inc.) were added to a round-bottom flask. Over a 10-minute period, 11.18 grams of a 3N acetic acid solution (17.6% acetic acid and 82.4% water) were slowly added to the flask while stirring. The round-bottom flask was then fitted with a distillation head, distillation column, and collection flask. The solution was heated at 92.5° C. for 4 hours. The flask was then emptied into a bottle, and then rinsed with 90.0 grams of PGMEA, which was also added to the bottle. The final solution had a 6.81% solids content.

2. Hardmask Formulation

A hardmask formulation was prepared by mixing 8.00 grams of the polymer solution prepared above with 14.93 grams of PGMEA, 3.76 grams of PGME, and 0.68 grams of a 0.4% solution of benzyltriethylamino chloride (BTEAC) in PGME to make a 2.0% solids solution by weight. The hardmask formulation was spin-coated onto a 4-inch silicon wafer at 1,500 rpm for 60 seconds, followed by baking on a hotplate at 240° C. for 60 seconds. The resulting cured film was measured by ellipsometry to be 648 Å thick and was insoluble in the casting solvents. The optical constants of the film are shown in Table 4.

TABLE 4

| | n-value (193 nm) | k-value (193 nm) | n-value (248 nm) | k-value (248 nm) |
|---|---|---|---|---|
| Titanium/Silicon Sol-gel Hardmask 3 | 1.55 | 0.17 | 1.58 | 0.15 |

Example 5

Titanium/Zirconium Nanoparticle Hardmask

1. Nanocluster Synthesis

In this procedure, a hardmask formulation comprising nanoclusters was prepared. First, 1.94 grams of titanium n-butoxide, 97% (Gelest) were added to a round-bottom flask, followed by 2.71 grams of zirconium n-butoxide (80% solution in butyl alcohol; Gelest). Next, a solution of 4.17 grams of methacrylic acid, 99% (Sigma-Aldrich) was added to the mixture and stored at room temperature. After 1 week, the synthesized nanoclusters were isolated by decanting the mother liquor, followed by drying under vacuum at room temperature for 24 hours.

2. Hardmask Formulation

A hardmask formulation was prepared by mixing 1.12 grams of the dried nanoclusters prepared above with 18.93 grams of PGME to make a 5.6% solids solution by weight. The hardmask formulation was spin-coated onto a 4-inch silicon wafer at 1,500 rpm for 60 seconds, followed by baking on a hotplate at 205° C. for 60 seconds. The resulting cured film was measured by ellipsometry to be 745 Å thick and was insoluble in the casting solvents. The optical constants and the etch rates of the film are shown in Table 5.

TABLE 5

| | n-value (193 nm) | k-value (193 nm) | n-value (248 nm) | k-value (248 nm) | $CF_4$ Å/min | $O_2$ Å/min |
|---|---|---|---|---|---|---|
| Titanium/Zirconium Nanoparticle Hardmask | 1.65 | 0.34 | 1.91 | 0.25 | 146 | 26.8 |

Example 6

Hafnium Nanoparticle Hardmask

1. Nanocluster Synthesis

In this procedure, a second hardmask formulation comprising nanoclusters was prepared. First, 1.5834 grams of hafnium n-butoxide, 95% (Gelest) were added to a flask, followed by 1.610 grams of a solution of 99% by weight of methacrylic acid (Sigma-Aldrich). The mixture was then stored at room temperature for 1 week. Next, the synthesized nanoclusters were isolated by decanting the mother liquor, followed by drying under vacuum at room temperature for 24 hours.

2. Hardmask Formulation

A hardmask formulation was prepared by mixing 0.314 grams of the dried nanoclusters prepared above with 19.69 grams of PGME to make a 1.57% solids solution by weight. The hardmask formulation was spin-coated onto a 4-inch silicon wafer at 1,500 rpm for 60 seconds, followed by baking on a hotplate at 205° C. for 60 seconds. The resulting cured film was measured by ellipsometry to be 170 Å thick and was insoluble in the casting solvents. The optical constants and the etch rates of the film are shown in Table 6.

TABLE 6

| | n-value (193 nm) | k-value (193 nm) | n-value (248 nm) | k-value (248 nm) | $CF_4$ Å/min | $O_2$ Å/min |
|---|---|---|---|---|---|---|
| Hafnium Nanoparticle Hardmask | 1.67 | 0.3 | 1.8 | — | 120 | 38 |

Example 7

Titanium/Silicon Hardmask Monomer/Polymer Blend

In this procedure, a titanium/silicon hardmask was formulated by adding 19.95 grams of poly(vinyltrimethoxysilane) (15% solids in PGMEA, formulated in-house), 4.24 grams of titanium IV bis(ethylacetoacetate) diisopropoxide (10 mmol, Gelest, Morrisville, Pa.), and 19.44 grams of PGMEA (Ultra Pure Solutions, Inc., Castroville, Calif.) to a flask. The solution was then stirred for 16 hours to yield the hardmask formulation. The formulation was spin-coated at 1,500 rpm onto a silicon substrate and then baked at 205° C. for 60 seconds. An ArF photoresist (TArF Pi6001; from TOK) was spin-coated on top of the hardmask layer at 1,500 rpm, followed by baking at 120° C. for 60 seconds. The stack was then exposed, followed by PEB at 110° C. for 60 seconds and developed by puddling with TMAH for 30 seconds, followed by a water rinse and spin dry.

Example 8

Titanium/Silicon Hardmask Monomer/Polymer Blend 2

In this procedure, a titanium/silicon hardmask formulation was prepared by adding 20.37 grams of poly(vinyltrimethoxysilane) (15% solids in PGMEA), 4.07 grams of titanium diisopropoxide (bis-2,4-pentanedionate) (75% solids in isopropanol (IPA), Gelest), and 75.56 grams of PGMEA (Ultra Pure Solutions, Inc.) to a flask. The solution was stirred for 16 hours to yield the hardmask formulation. The resulting formulation was spin-coated at 1,500 rpm onto a silicon substrate and then baked at 205° C. for 60 seconds. An ArF photoresist (TArF Pi6001; from TOK) was spin-coated on top of the hardmask layer at 1,500 rpm, followed by baking at 120° C. for 60 seconds. The film stack was then exposed, subjected to PEB at 110° C. for 60 seconds and developed by puddling with TMAH for 30 seconds, followed by a water rinse and spin dry.

Example 9

Zirconium/Silicon Hardmask Monomer/Polymer Blend

In this procedure, a zirconium/silicon hardmask formulation was prepared by adding 2.67 grams of poly(vinyltrimethoxysilane) (15% solids in PGMEA), 0.67 grams of zirconium di-n-butoxide (bis-2,4-pentanedionate) (60% solids in n-butanol, Gelest), and 11.67 grams of PGMEA (Ultra Pure Solutions, Inc.) to a flask. The solution was stirred for 16 hours to yield the hardmask formulation. The resulting formulation was spin-coated at 1,500 rpm onto a silicon substrate and then baked at 205° C. for 60 seconds. An ArF photoresist (TArF Pi6001; from TOK) was spin-coated on top of the hardmask layer at 1,500 rpm, followed by baking at 120° C. for 60 seconds. The film stack was then exposed, subjected to PEB at 110° C. for 60 seconds and developed by puddling with TMAH for 30 seconds, followed by a water rinse and spin dry.

Example 10

Hafnium/Silicon Hardmask Monomer/Polymer Blend

In this procedure, a hafnium/silicon hardmask formulation was prepared by adding 2.67 grams of poly(vinyltrimethoxysilane) (15% solids in PGMEA), 0.80 grams of hafnium di-n-butoxide (bis-2,4-pentanedionate) (50% solids in toluene/n-butanol, Gelest), and 12.53 grams of PGMEA (Ultra Pure Solutions, Inc.) to a flask. The solution was then stirred for 16 hours. The resulting formulation was spin-coated at 1,500 rpm onto a silicon substrate and then baked at 205° C. for 60 seconds. An ArF photoresist (TArF Pi6001; from TOK) was spin-coated on top of the hardmask layer at 1,500 rpm, followed by baking at 120° C. for 60 seconds. The film stack was then exposed, subjected to PEB at 110° C. for 60 seconds and developed by puddling with TMAH for 30 seconds, followed by a water rinse and spin dry.

We claim:

1. A hardmask composition comprising a metal-oxide precursor compound dispersed or dissolved in a solvent system, said precursor compound being selected from the group consisting of polymers, oligomers, monomers, and mixtures thereof, wherein:

said polymers and oligomers comprise recurring monomeric units of:

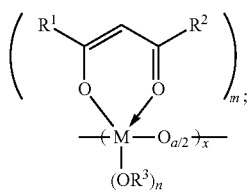
(I)

and
said monomers have the formula:

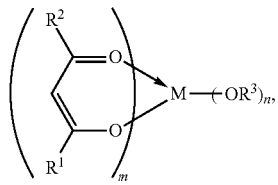
(II)

where:
m is at least 1;
each n is individually 1-3;
a is 2-4;
x denotes the monomeric repeat unit;
M is a metal or metalloid other than silicon;
each $R^1$ and $R^2$ is individually selected from the group consisting of hydrogen, alkyls, aryls, alkoxys, phenoxys, and acetoxys; and
each $R^3$ is individually selected from the group consisting of alkyls and carbonyls,
said composition being substantially free of silicon.

2. The composition of claim 1, wherein each M is individually selected from the group consisting of aluminum, titanium, zirconium, vanadium, germanium, aluminum, hafnium, gallium, thallium, antimony, lead, bismuth, indium, tin, boron, germanium, arsenic, tellurium, and rare earth metals.

3. The composition of claim 1, said composition being substantially free of crosslinking agents.

4. The composition of claim 1, said composition being substantially free of added chromophores or light attenuating moieties.

5. The composition of claim 1, wherein said precursor compound is a polymer or oligomer, said precursor compound being present in the composition at a level of from about 0.1% to about 5% by weight, based upon the total weight of the composition taken as 100% by weight.

6. The composition of claim 1, wherein said precursor compound is a monomer, said precursor compound being present in the composition at a level of from about 0.3% to about 5% by weight, based upon the total weight of the composition taken as 100% by weight.

7. A hardmask composition comprising a metal-oxide precursor compound dispersed or dissolved in a solvent system, said precursor compound being selected from the group consisting of polymers, oligomers, monomers, and mixtures thereof, wherein:

said polymers and oligomers comprise recurring monomeric units of:

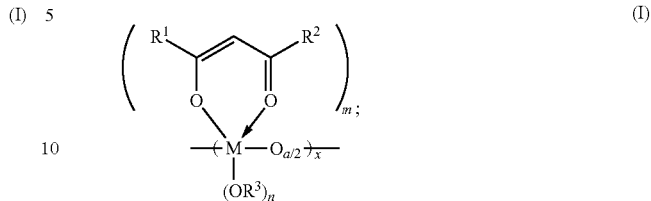
(I)

and
said monomers have the formula:

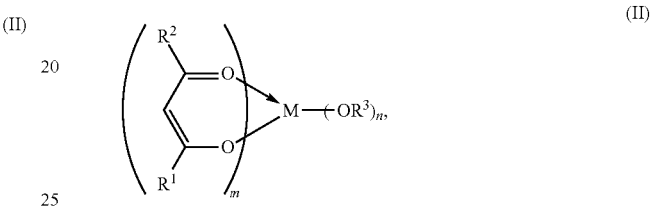
(II)

where:
each m is at least 2;
each n is individually 1-3;
a is 2-4;
x denotes the monomeric repeat unit;
M is a metal or metalloid other than silicon;
each $R^1$ and $R^2$ is individually selected from the group consisting of hydrogen, alkyls, aryls, alkoxys, phenoxys, and acetoxys; and
each $R^3$ is individually selected from the group consisting of alkyls and carbonyls,
said composition further comprising silicon, and being insoluble in aqueous alkaline developers.

8. The composition of claim 7, wherein each M is individually selected from the group consisting of aluminum, titanium, zirconium, vanadium, germanium, aluminum, hafnium, gallium, thallium, antimony, lead, bismuth, indium, tin, boron, germanium, arsenic, tellurium, and rare earth metals.

9. The composition of claim 7, wherein said precursor compound is a polymer or oligomer, said precursor compound being present in the composition at a level of from about 0.3% to about 5% by weight, based upon the total weight of the composition taken as 100% by weight.

10. The composition of claim 7, wherein said precursor compound is a monomer, said precursor compound being present in the composition at a level of from about 0.3% to about 5% by weight, based upon the total weight of the composition taken as 100% by weight.

11. The composition of claim 7, wherein said composition comprises from about 0.025% to about 10% by weight silicon, based upon the total weight of the composition taken as 100% by weight.

12. The composition of claim 7, wherein said silicon is present as silicon-containing monomeric repeat units having the formula:

(III)

where:
y denotes the monomeric repeat unit;
z is 1-2; and
each $R^4$ is individually selected from the group consisting of phenyls, alkyls, hydrogen, alkenyls, and alkynyls.

13. The composition of claim 12, wherein said precursor compound is a polymer or oligomer of formula (I), said silicon-containing monomeric repeat units being present as co-monomers in said polymer or oligomer.

14. The composition of claim 13, wherein the ratio of x:y in said precursor compound is from about 10:1 to about 1:10.

15. The composition of claim 12, wherein said precursor compound is a monomer, said silicon-containing monomeric repeat units being present as silicon polymers dispersed or dissolved in said solvent system with said precursor compound.

16. The composition of claim 7, wherein said silicon is present as silicon-containing monomers dispersed or dissolved in said solvent system with said precursor compound, said silicon-containing monomers being selected from the group consisting of:
$Si(OR^3)_n(R^4)_m$, $Si(Cl)_n(R^4)_m$, and combinations thereof,
where:
each m is individually 0-2;
each n is individually 2-4;
each $R^3$ is individually selected from the group consisting of alkyls, phenyls, siloxyls; and
each $R^4$ is individually selected from the group consisting of phenyls, alkyls, hydrogen, alkenyls, alkynyls, naphthyls, silyls, and pyridyls.

17. The composition of claim 16, wherein said composition comprises from about 0.025% to about 10% by weight silicon, based upon the total weight of the composition taken as 100% by weight.

18. The composition of claim 7, said composition being substantially free of crosslinking agents.

19. The composition of claim 7, said composition being substantially free of added chromophores or light attenuating moieties.

20. A method of forming a microelectronic structure, said method comprising:
providing a substrate having a surface;
optionally forming one or more intermediate layers on said surface;
applying a hardmask composition adjacent said intermediate layers, if present, or adjacent said substrate surface if no intermediate layers are present to form a stack, said hardmask composition comprising a metal-oxide precursor compound dissolved or dispersed in a solvent system, wherein said precursor compound is selected from the group consisting of polymers, oligomers, monomers, and mixtures thereof, wherein:
said polymers and oligomers comprise recurring monomeric units of:

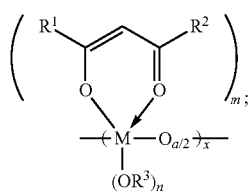

(I)

and
said monomers have the formula:

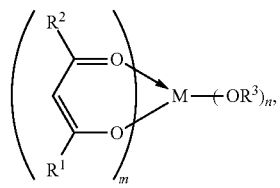

(II)

where:
each m is at least 2;
each n individually is 1-3;
a is 2-4;
x denotes the monomeric repeat unit;
M is a metal or metalloid other than silicon;
each $R^1$ and $R^2$ is individually selected from the group consisting of hydrogen, alkyls, aryls, alkoxys, phenoxys, and acetoxys; and
each $R^3$ is individually selected from the group consisting of alkyls, and carbonyls,
said composition further comprising silicon;
heating said hardmask composition to yield a cured hardmask layer comprising a metal oxide film, wherein said cured hardmask layer is insoluble in aqueous alkaline developers.

21. The method of claim 20, wherein said silicon is present as silicon-containing monomeric repeat units having the formula:

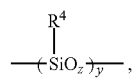

(III)

where:
y denotes the monomeric repeat unit;
z is 1-2; and
each $R^4$ is individually selected from the group consisting of phenyls, alkyls, hydrogen, alkenyls, and alkynyls.

22. The method of claim 21, wherein said precursor compound is a polymer or oligomer of formula (I), said silicon-containing monomeric repeat units being present as co-monomers in said polymer or oligomer.

23. The method of claim 21, wherein said precursor compound is a monomer, said silicon-containing monomeric repeat units being present as silicon polymers dispersed or dissolved in said solvent system with said precursor compound.

24. The method of claim 20, wherein said silicon is present as silicon-containing monomers dispersed or dissolved in said solvent system with said precursor compound, said silicon-containing monomers being selected from the group consisting of:
$Si(OR^3)_n(R^4)_m$, $Si(Cl)_n(R^4)_m$, and combinations thereof,
where:
each m is individually 0-2;
each n is individually 2-4;
each $R^3$ is individually selected from the group consisting of alkyls, phenyls and siloxyls; and each $R^4$ is individually selected from the group consisting of phenyls, alkyls, hydrogen, naphthyls, silyls, and pyridyls.

25. A microelectronics structure comprising:
a substrate having a surface;
one or more optional intermediate layers adjacent said substrate surface; and
a cured hardmask layer adjacent said intermediate layers if present, or adjacent said substrate surface when no intermediate layers are present, said cured hardmask layer being insoluble in aqueous alkaline developers, and being formed from a hardmask composition comprising a metal-oxide precursor compound dispersed or dissolved in a solvent system, said precursor compound being selected from the group consisting of polymers, oligomers, monomers, and mixtures thereof, wherein:
said polymers and oligomers comprise recurring monomeric units of:

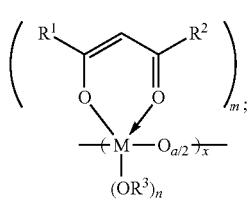
(I)

and
said monomers have the formula:

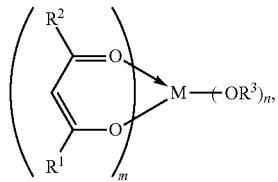
(II)

where:
m is at least 1;
each n is individually 1-3;
a is 2-4;
x denotes the monomeric repeat unit;
M is a metal or metalloid other than silicon;
each $R^1$ and $R^2$ is individually selected from the group consisting of hydrogen, alkyls, aryls, alkoxys, phenoxys, and acetoxys; and
each $R^3$ is individually selected from the group consisting of alkyls, phenyls, and carbonyls, said composition being substantially free of silicon.

26. The structure of claim 25, wherein said intermediate layers are selected from the group consisting of spin-on carbon layers, amorphous carbon layers, bottom anti-reflective coatings, planarization layers, and combinations of the foregoing.

27. The structure of claim 26, wherein said structure comprises a spin-on carbon intermediate layer, said structure being free of any anti-reflective layers.

28. A microelectronics structure comprising:
a substrate having a surface;
one or more optional intermediate layers adjacent said substrate surface; and
a cured hardmask layer adjacent said intermediate layers if present, or adjacent said substrate surface when no intermediate layers are present, said cured hardmask layer being insoluble in aqueous alkaline developers, and being formed from a hardmask composition comprising a metal-oxide precursor compound dispersed or dissolved in a solvent system, wherein said precursor compound is selected from the group consisting of polymers, oligomers, monomers, and mixtures thereof, wherein:
said polymers and oligomers comprise recurring monomeric units of:

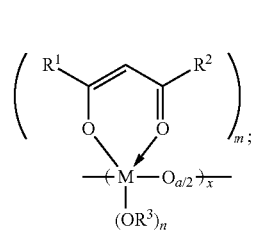
(I)

and
said monomers have the formula:

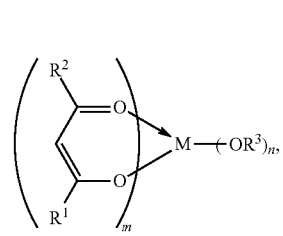
(II)

where:
each m is at least 2;
each n is individually 1-3;
a is 2-4;
x denotes the monomeric repeat unit;
M is a metal or metalloid other than silicon;
each $R^1$ and $R^2$ is individually selected from the group consisting of hydrogen, alkyls, aryls, alkoxys, phenoxys, and acetoxyl; and
each $R^3$ is individually selected from the group consisting of alkyls and carbonyls,
said composition further comprising silicon.

* * * * *